(12) United States Patent
Tong

(10) Patent No.: US 8,716,125 B2
(45) Date of Patent: May 6, 2014

(54) METHODS OF IN-SITU VAPOR PHASE DEPOSITION OF SELF-ASSEMBLED MONOLAYERS AS COPPER ADHESION PROMOTERS AND DIFFUSION BARRIERS

(75) Inventor: Jinhong Tong, Santa Clara, CA (US)

(73) Assignee: Globalfoundries Inc., Grand Caymen (KY)

( * ) Notice: Subject to any disclaimer, the term of this patent is extended or adjusted under 35 U.S.C. 154(b) by 0 days.

(21) Appl. No.: 13/571,470

(22) Filed: Aug. 10, 2012

(65) Prior Publication Data

US 2014/0045330 A1   Feb. 13, 2014

(51) Int. Cl.
*H01L 21/4763*  (2006.01)
*H01L 21/44*  (2006.01)
*H01L 21/31*  (2006.01)
*H01L 21/469*  (2006.01)

(52) U.S. Cl.
USPC ........... 438/627; 438/778; 438/637; 438/780; 438/622; 438/687; 438/761; 438/653; 438/618; 438/628

(58) Field of Classification Search
USPC ......... 438/618, 622, 627, 638, 643, 644, 687, 438/778, 637, 780, 761, 653
See application file for complete search history.

(56) References Cited

U.S. PATENT DOCUMENTS

| | | | |
|---|---|---|---|
| 6,919,636 B1 * | 7/2005 | Ryan .............................. | 257/751 |
| 2004/0245518 A1 | 12/2004 | Ramanath et al. | |
| 2005/0110149 A1 * | 5/2005 | Osaka et al. ................. | 257/758 |
| 2008/0105979 A1 * | 5/2008 | Whelan et al. ................ | 257/751 |
| 2008/0197513 A1 * | 8/2008 | Restaino et al. .............. | 257/784 |

OTHER PUBLICATIONS

Hankins et al., "Vapor deposition of amino-functionalized self-assembled monolayers on MEMS", Proc. SPIE 4980, Reliability, Testing, and Characterization of MEMS/MOEMS II, 2003, pp. 238-247.*
Naoto Shirahata "Advantages of a Programmed Surface Designed by Organic Monolayers", Nanofabrication, Yoshitake Masuda (Ed.), InTech, 2011, pp. 217-242.*
Zhang et al. "Chemical Vapor Deposition of Three Aminosilanes on Silicon Dioxide: Surface Characterization, Stability, Effects of Silane Concentration, and Cyanine Dye Adsorption", Langmuir, 2010, 26 (18), pp. 14648-14654.*
Hong et al. "ALD Resist Formed by Vapor-Deposited Self-Assembled Monolayers", Langmuir, 2007, 23 (3), pp. 1160-1165.*
Borges et al. "Functionalization of Copper Surfaces by Plasma Treatments to Improve Adhesion of Epoxy Resins", Plasma Processes and Polymers, vol. 6, 2009, pp. S490-S495.*
Hu, M. et al., "Effect of interfacial interactions on the initial growth of Cu on clean SiO2 and 3-mercaptopropyltrimethoxysilane-modified SiO2 substrates". J. Vac. Sci. Technol. A 20(3), 2002, p. 589.
Hankins, M. et al., "Vapor deposition of amino-functionalized self-assembled monolayers on MEMS".Proc. SPIE 4980, 238 (2003).

* cited by examiner

Primary Examiner — Mary Wilczewski
Assistant Examiner — Erik T Peterson
(74) Attorney, Agent, or Firm — Darrell L. Pogue; Keohane & D Alessandro

(57) ABSTRACT

Embodiments of the present invention provide methods of in-situ vapor phase deposition of self-assembled monolayers as copper adhesion promoters and diffusion barriers. A copper region is formed in a dielectric layer. A diffusion barrier comprising a self-assembled monolayer is deposited over the copper region. A capping layer is deposited over the self-assembled monolayer. In some embodiments, the capping layer and self-assembled monolayer are deposited in the same process chamber.

17 Claims, 4 Drawing Sheets

US 8,716,125 B2

METHODS OF IN-SITU VAPOR PHASE DEPOSITION OF SELF-ASSEMBLED MONOLAYERS AS COPPER ADHESION PROMOTERS AND DIFFUSION BARRIERS

FIELD OF THE INVENTION

This invention relates generally to the field of semiconductors, and more particularly, to methods of in-situ vapor phase deposition of self-assembled monolayers.

BACKGROUND

As integrated circuit device size continues to shrink in order to achieve higher operating frequencies, lower power consumption, and overall higher productivity, fabricating reliable interconnections has become increasingly difficult with respect to both manufacturing and performance.

In order to fabricate a reliable device with a fast operating speed, copper (Cu) is becoming a material of choice for forming the interconnection lines since it has lower electrical resistance compared with that of aluminum and is less prone to electromigration and stress migration.

However, Cu has various shortcomings. For example, Cu has bad adhesive strength to SiO2 and other dielectric materials. Hence, reliable diffusion barriers and adhesion promoters are needed to make copper interconnects feasible. Some currently used interfacial barrier layer materials include tantalum (Ta), tantalum nitride (TaN) and titanium (TiN). When these layers are deposited by conventional methods, they are difficult to form as uniform and continuous layers. This is especially true when the layers to be deposited are less than 10 nanometers thick, and when the layers are formed in high aspect ratio (e.g., depth to width) features such as vias. The Cu/capping layer interface has been known to contribute to electromigration (EM) failure, so optimizing the Cu/cap interface is critical for EM reliability performance. It is therefore desirable to have improved methods for forming copper adhesion promoters and diffusion barriers.

SUMMARY

In general, embodiments of the invention provide a method for in-situ vapor phase deposition of self-assembled monolayers as copper adhesion promoters and diffusion barriers. A copper region is formed in a dielectric layer. A diffusion barrier made of a self-assembled monolayer is deposited over the copper region. A capping layer is deposited over the self-assembled monolayer. In some embodiments, the capping layer and self-assembled monolayer are deposited in the same process chamber. Embodiments of the present invention may provide advantages such as reduced risk of unwanted oxidation of the copper region during the fabrication process, reduced material waste, and improved adhesion and effectiveness of the barrier layer between the copper region and the capping layer, as compared to prior art barrier layer materials.

One aspect of the present invention includes a method of forming a semiconductor structure. The method includes forming a via in a dielectric layer; forming a first barrier layer in the via; forming a copper region in the via; depositing a second barrier layer over the copper region; and depositing a capping layer over the second barrier layer. Depositing a second barrier layer includes depositing a self-assembled monolayer in a chamber of a chemical vapor deposition tool.

Another aspect of the present invention includes a method of forming a semiconductor structure. The method includes forming a via in a dielectric layer; forming a first barrier layer in the via; forming a copper region in the via; depositing a second barrier layer over the copper region; and depositing a capping layer over the second barrier layer. Depositing a second barrier layer includes depositing a self-assembled monolayer in a chamber of an atomic layer deposition tool.

Another aspect of the present invention includes a method of forming a semiconductor structure. The method includes forming a via in a dielectric layer; forming a first barrier layer in the via; forming a copper region in the via; depositing a second barrier layer over the copper region; and depositing a capping layer over the second barrier layer. Depositing a second barrier layer includes depositing a self-assembled monolayer in a chamber of a plasma enhanced chemical vapor deposition tool.

BRIEF DESCRIPTION OF THE DRAWINGS

These and other features of this invention will be more readily understood from the following detailed description of the various aspects of the invention taken in conjunction with the accompanying drawings in which.

Figure 1:
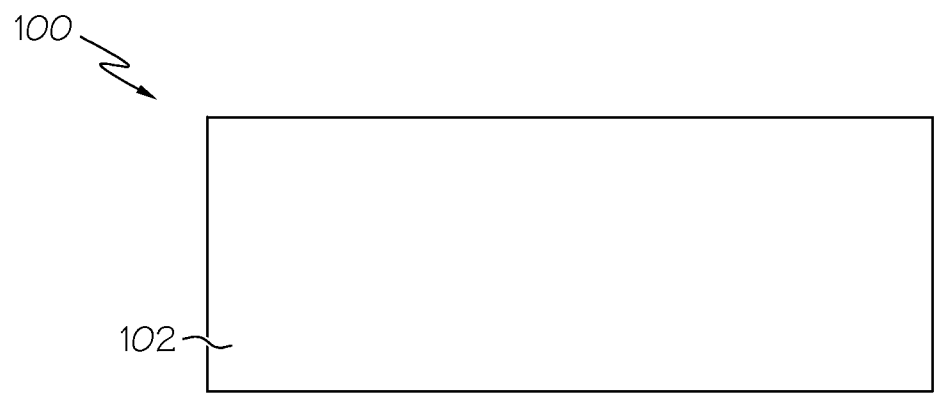
FIG. 1 shows a semiconductor structure at a starting point for an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Exemplary embodiments of the invention provide approaches for deposition of self-assembled monolayer (SAM) films using in-situ vapor phase deposition techniques. In some embodiments, a SAM film is formed over a copper region, and a capping layer is in turn formed over the SAM film in the same processing chamber. This reduces the risk of undesirable copper oxidation during the fabrication process. Furthermore, the strong interfacial bonding can immobilize Cu, and reduce Cu ion injection into the ILD interface, therefore lowering the time-dependent dielectric breakdown (TDDB) risk.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

With reference again to the figures, FIG. 1 shows a semiconductor structure 100 at a starting point for an embodiment of the present invention. Semiconductor structure 100 includes a dielectric layer 102. Dielectric layer 102 may be an interlevel dielectric layer (ILD). The ILD may contain multiple dielectric layers and optionally, one or more etch stop layers.

Figure 2:
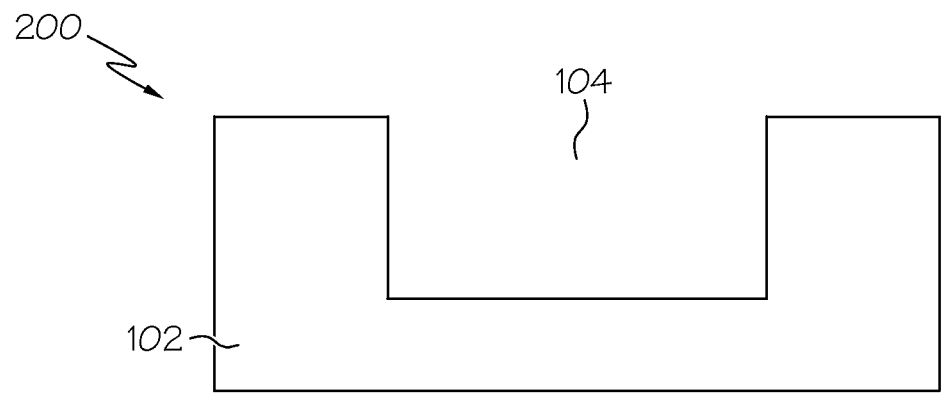
FIG. 2 shows a semiconductor structure after a subsequent processing step of forming a via according to illustrative embodiments.

FIG. 2 shows a semiconductor structure 200 after a subsequent processing step of forming a via 104 in the dielectric layer 102. The via may be formed using industry-standard etching and lithographic techniques.

Figure 3:
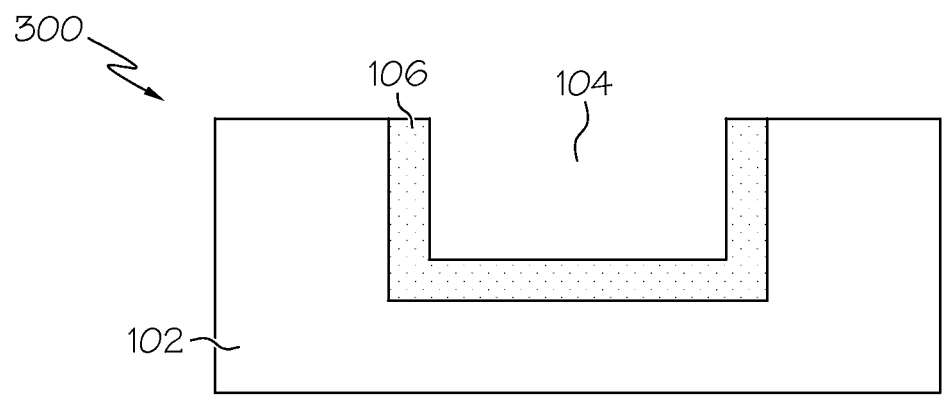
FIG. 3 shows a semiconductor structure after a subsequent processing step of forming a first barrier layer according to illustrative embodiments.

FIG. 3 shows a semiconductor structure 300 after a subsequent processing step of forming a first barrier layer 106 on the interior surfaces of the via 104. The first barrier layer may be a metal layer, such as a tantalum based layer. The first barrier layer may be formed by any suitable deposition method, including, but not limited to, physical vapor deposition (PVD), chemical vapor deposition (CVD), plasma enhanced chemical vapor deposition (PECVD) or atomic layer deposition (ALD).

Figure 4:
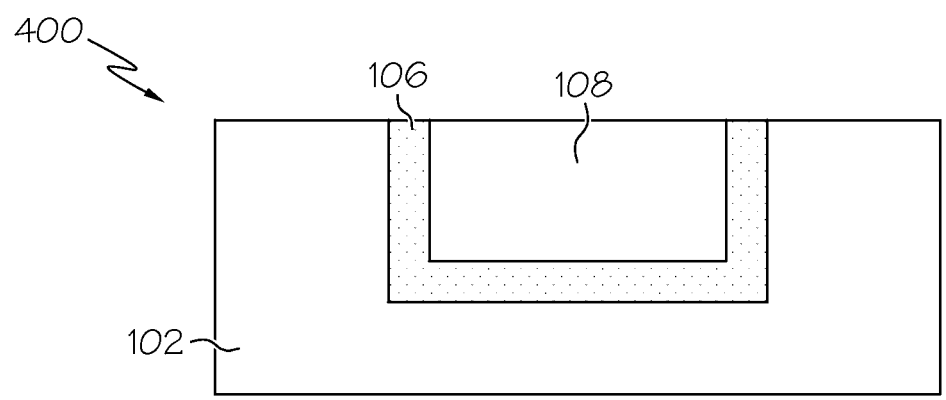
FIG. 4 shows a semiconductor structure after a subsequent processing step of forming a copper region according to illustrative embodiments.

FIG. 4 shows a semiconductor structure 400 after a subsequent processing step of forming a copper region 108, filling the via (compare with 104 of FIG. 3). The copper region 108 may be formed by any suitable deposition method, including, but not limited to, electroplating. After deposition of copper region 108, Cu is annealed to stabilize the crystal structure, and then a planarization process, such as a chemical mechanical polish (CMP) may be performed to make the copper region 108 planar with the first barrier layer 106 and dielectric layer 102.

Figure 5:
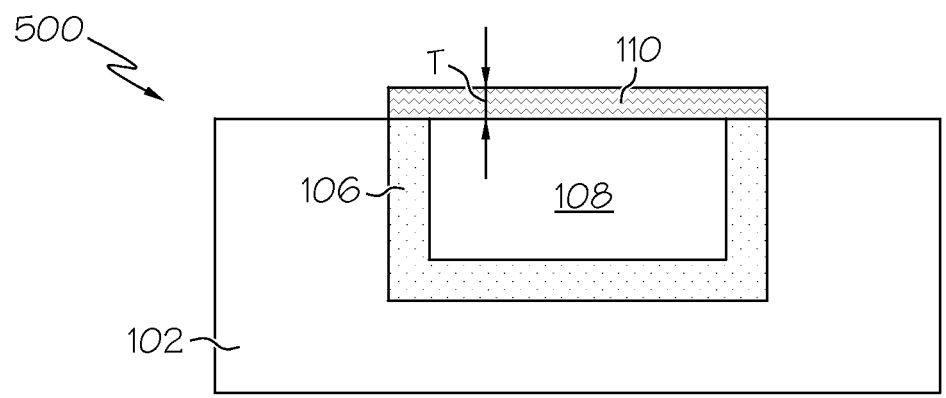
FIG. 5 shows a semiconductor structure after a subsequent processing step of forming a second barrier layer according to illustrative embodiments.

FIG. 5 shows a semiconductor structure 500 after a subsequent processing step of forming a second barrier layer 110. The second barrier layer is a self-assembled monolayer (SAM), and is deposited via in-situ vapor phase deposition techniques. In one embodiment, the SAM layer 110 is deposited via a chemical vapor deposition tool. In another embodiment, the SAM layer 110 is deposited via a plasma enhanced chemical vapor deposition tool. In embodiments, the SAM layer 110 has a thickness T ranging from about 10 angstroms to about 30 angstroms. Embodiments of the present invention may utilize a variety of SAMs, including, but not limited to, amino-silanes, mercapto-silanes, and organosilanes with aromatic rings.

Some of the amino-silane SAMs that may be used include:
APTMS: $H_2NCH_2CH_2CH_2Si(OCH_3)_3$;
APTES: $H_2NCH_2CH_2CH_2Si(OC_2H_5)_3$;
APDMS: 3 aminopropyldimethylethoxysilane;
N-(2-aminoethyl)-3-aminopropyltrimethoxysilane (EDA);
(3-trimethoxysilylpropyl) diethylenetriamine (DETA);
4-aminophenyltrimethoxysilane; and
Phenylamino-methyltrimethoxysilane.

Some of the mercapto-silane SAMs that may be used include:
MPTMS: 3-Mercaptopropyltrimethoxysilane: $HS(CH_2)_3Si(OCH_3)_3$;
MPTES: 3-Mercaptopropyltriethoxysilane: $HS(CH_2)_3Si(OC_2H_5)_3$; and
MPMDMS: 3-Mercaptopropylmethyldimethoxysilane: $HS(CH_2)_3Si(CH_3)(OCH_3)_2$.

Organosilanes with an aromatic ring may include $(CH_2)_n-Si(OCH_3)_3$.

Parameters for the deposition may include a reaction temperature in the range of about 50 degrees Celsius to about 120 degrees Celsius, a silane precursor vapor pressure ranging from about 0.1 Torr to about 10 Torr, and a reaction time ranging from about 1 minute to about 30 minutes.

Figure 6:
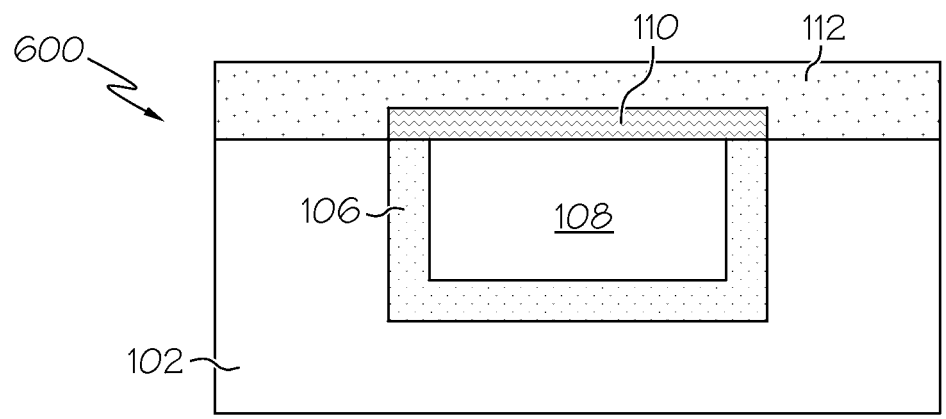
FIG. 6 shows a semiconductor structure after a subsequent processing step of forming a capping layer according to illustrative embodiments.

FIG. 6 shows a semiconductor structure 600 after a subsequent processing step of forming a capping layer 112. In embodiments, the capping layer 112 may include silicon carbide or silicon carbide nitride. In embodiments, the capping layer 112 may be deposited in the same chamber as the second barrier layer 110. This provides the advantage of preventing the formation of oxide on copper region 108, as it limits the exposure of copper region 108 to ambient air. Other advantages may include reduction of the generation of contaminated effluents and polymerized products, and efficient coating of high-aspect-ratio structures. In other embodiments, a first chamber may be used for depositing the second barrier layer 110 and a second chamber used for depositing the capping layer 112. A transfer chamber may be used to transport wafers between the first and second chambers. In these embodiments, the second barrier layer 110 may be deposited from an atomic layer deposition (ALD) chamber, or a plasma-enhanced ALD (PEALD) chamber.

Figure 7:
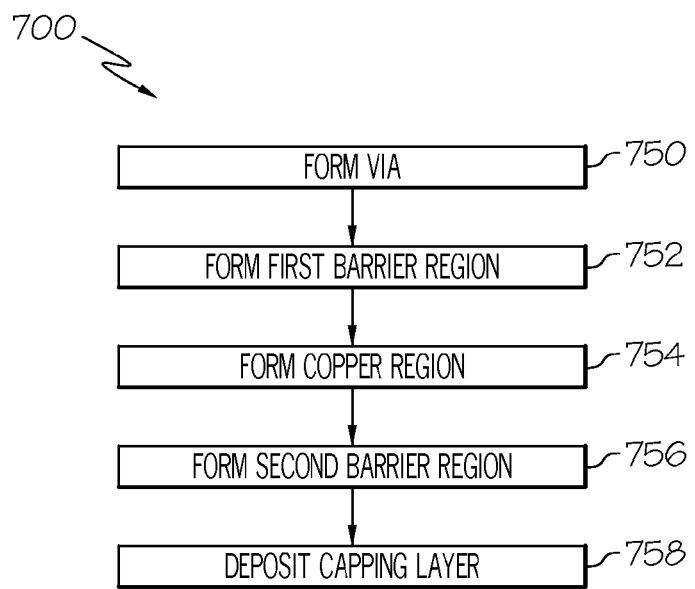
FIG. 7 shows a flowchart according to illustrative embodiments.

FIG. 7 shows a flowchart 700 according to illustrative embodiments. In process step 750, a via is formed (see 104 of FIG. 2). In process step 752, a first barrier region is formed (see 106 of FIG. 3). In some embodiments, the first barrier region may be of a metal or metal compound, such as tantalum or a tantalum based compound. In other embodiments, the first barrier region may include a self-assembled monolayer. In some embodiments, the first barrier region may be of the same material as the second barrier region. In process step 754, a copper region is formed (see 108 of FIG. 5). In process step 756, a second barrier region is formed (see 110 of FIG. 5). The second barrier region is a self-assembled monolayer, and is deposited via in-situ vapor deposition, using a tool such as a chemical vapor deposition (CVD) tool, plasma enhanced chemical vapor deposition (PECVD) tool, ALD tool or PEALD tool. In process step 758, a capping layer is deposited (see 112 of FIG. 6). In embodiments, the capping layer 112 may include silicon carbide or silicon carbide nitride. In embodiments, the capping layer 112 may be deposited in the same chamber as the second barrier layer 110 in subsequent processing steps. Therefore, both the second barrier layer 110 and capping layer 112 are deposited on the semiconductor structure without the semiconductor structure (e.g. wafer) leaving the chamber in between the deposition of the second barrier layer 110 and the deposition of the capping layer 112.

Figure 8:
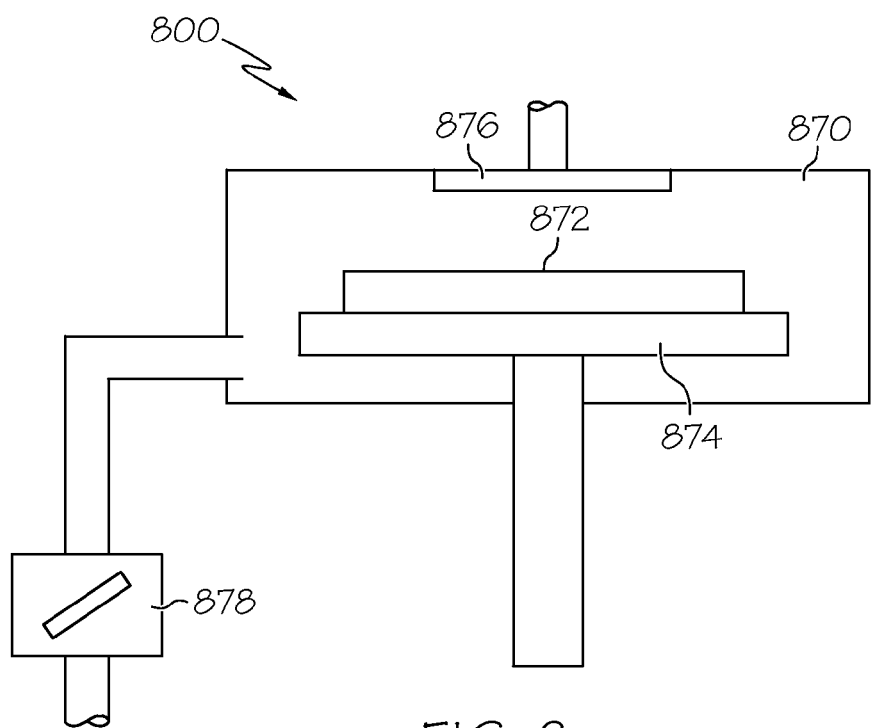
FIG. 8 shows a portion of a deposition tool for carrying out illustrative embodiments.

FIG. 8 shows a portion of a deposition tool 800 for carrying out illustrative embodiments. Deposition tool 800 includes a processing chamber 870. Disposed within chamber 870 is a wafer 872, which is supported by a pedestal 874. A reaction gas is applied evenly to the wafer 872 via gas inlet 876. The pressure within the processing chamber 870 is controlled via regulating valve 878. By depositing both the second barrier layer 110 and the capping layer 112 in chamber 870, the problem of unwanted oxidation on copper region 108 is mitigated (see FIG. 6), and thus, the semiconductor fabrication process is improved.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also include hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for in-situ vapor phase deposition of self-assembled monolayers. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure comprising:
 forming a via in a dielectric layer;
 forming a first barrier layer in the via;
 forming a copper region in the via;
 depositing a second barrier layer over the copper region; and
 depositing a capping layer over the second barrier layer;
 wherein depositing the second barrier layer comprises depositing a self-assembled monolayer in a chamber of a chemical vapor deposition tool; and
 wherein depositing the capping layer over the second barrier layer is performed in the chamber of the chemical vapor deposition tool.

2. The method of claim 1, wherein depositing the capping layer over the second barrier layer comprises depositing silicon carbide.

3. The method of claim 1, wherein depositing the self-assembled monolayer comprises depositing an amino-silane.

4. The method of claim 3, wherein depositing the amino-silane comprises depositing $H_2NCH_2CH_2CH_2Si(OCH_3)_3$.

5. The method of claim 3, wherein depositing the amino-silane comprises depositing $H_2NCH_2CH_2CH_2Si(OC_2H_5)_3$.

6. The method of claim 3, wherein depositing the amino-silane comprises depositing 3-aminopropyldimethylethoxysilane.

7. The method of claim 3, wherein depositing the amino-silane comprises depositing N-(2-aminoethyl)-3-aminopropyltrimethoxysilane.

8. The method of claim 3, wherein depositing the amino-silane comprises depositing (3-trimethoxysilylpropyl) diethylenetriamine.

9. The method of claim 3, wherein depositing the amino-silane comprises depositing 4-aminophenyltrimethoxysilane.

10. The method of claim 1, wherein depositing the self-assembled monolayer comprises depositing a mercapto-silane.

11. The method of claim 10, wherein depositing the mercapto-silane comprises depositing 3-Mercaptopropyltrimethoxysilane.

12. The method of claim 10, wherein depositing the mercapto-silane comprises depositing 3-Mercaptopropyltriethoxysilane.

13. The method of claim 10, wherein depositing the mercapto-silane comprises depositing 3-Mercaptopropylmethyldimethoxysilane.

14. The method of claim 1, wherein depositing the self-assembled monolayer comprises depositing an organosilane.

15. The method of claim 1, wherein the first barrier layer is comprised of the same material as the second barrier layer.

16. A method of forming a semiconductor structure comprising:
 forming a via in a dielectric layer;
 forming a first barrier layer in the via;
 forming a copper region in the via;
 depositing a second barrier layer over the copper region; and depositing a capping layer over the second barrier layer;
wherein the depositing the second barrier layer comprises depositing a self-assembled monolayer in a chamber of a chemical vapor deposition tool;
wherein the depositing the self-assembled monolayer comprises depositing an amino-silane; and wherein the depositing the amino-silane comprises depositing phenylamino-methyltrimethoxysilane.

17. A method of forming a semiconductor structure comprising:
forming a via in a dielectric layer;
forming a first barrier layer in the via;
forming a copper region in the via;
depositing a second barrier layer over the copper region; and
depositing a capping layer over the second barrier layer;
wherein the depositing a second barrier layer comprises depositing a self-assembled monolayer in a chamber of a plasma enhanced chemical vapor deposition tool; and
wherein the depositing a capping layer over the second barrier layer is performed in the chamber of the plasma enhanced chemical vapor deposition tool.

* * * * *